United States Patent [19]

Morille et al.

[11] Patent Number: 4,642,560
[45] Date of Patent: Feb. 10, 1987

[54] DEVICE FOR CONTROLLING CONTINUITY OF PRINTED CIRCUITS

[75] Inventors: Robert Morille, Saint Marcel Les Valence; Jacques Saroul, Valence, both of France

[73] Assignee: Crouzet, Paris, France

[21] Appl. No.: 613,024

[22] Filed: May 22, 1984

[30] Foreign Application Priority Data

Dec. 28, 1983 [FR] France .............................. 83 21055

[51] Int. Cl.$^4$ ...................... G01R 15/12; G01R 31/28
[52] U.S. Cl. ............................ 324/73 PC; 324/158 F
[58] Field of Search ............ 324/73 PC, 158 F, 158 P

[56] References Cited

U.S. PATENT DOCUMENTS

| 3,830,956 | 8/1974 | Wootton et al. | 324/73 PC X |
| 4,012,693 | 3/1977 | Sullivan | 324/73 PC |
| 4,056,773 | 11/1977 | Sullivan | 324/73 PC |
| 4,565,966 | 1/1986 | Burr et al. | 324/73 PC |

FOREIGN PATENT DOCUMENTS 2521305  8/1983  France .............................. 324/73 PC

OTHER PUBLICATIONS

IBM Technical Disclosure Bulletin, vol. 22, No. 7, Dec. '79, pp. 2704–2705, New York, US, L.M. Zobniw—'Orthogonal Shorts Detector.'
IBM Technical Disclosure Bulletin, vol. 26, No. 5, Oct. '83, pp. 2594–2595, New York, US; A. H. Kumar et al—"Liquid Crystal Electrical Continuity Tester".
Patents Abstracts of Japan, vol. 7, No. 15, pp. 169 (1160), 1983; and JP-A-57 172 260 (Hitachi Densen K.K.) 23-10-1982.
IBM Technical Disclosure Bulletin, vol. 12, No. 5, Oct. '69, pp. 655–656, New York, US; P. M. Degroat et al—"Finding Shorts in Printed Circuit Boards".

Primary Examiner—Ernest F. Karlsen
Assistant Examiner—Vinh Phu Nguyen
Attorney, Agent, or Firm—Stevens, Davis, Miller & Mosher

[57] ABSTRACT

The device according to the invention is intended for controlling the electrical continuity of the equipotential branchings of multi-layer printed circuits. It comprises selectors of a model of printed circuit to be controlled in order to effect, by superposition with the latter, the selection from the assembly E of the conductor elements accessible on at least one of the outer faces of the circuit, of two distinct sub-assemblies Ei and Ec, such that $E=Ei+Ec$; means for scanning said selectors in order to effect, by displacements in contact with the latter, detection of the defects in continuity; and indicators for translating the state of the electrical continuity in the branchings.

5 Claims, 3 Drawing Figures

DEVICE FOR CONTROLLING CONTINUITY OF PRINTED CIRCUITS

BACKGROUND OF THE INVENTION

The present invention relates to devices for the quality control of complex printed circuits and in particular those obtained in so-called "hybrid" industrial technology; these circuits, which are generally very compact, being constituted by multiple superposed layers of insulating material comprising a more or less high density of branched conductor elements.

Applicants previously disclosed in French Patent Application No. 2 521 305 the method and means for effecting quality control of the galvanic insulation which must normally exist between the different conductor elements—or "trees"—of such a type of multi-layer printed circuits.

Like the quality control of the insulation, that of the continuity is essentially dictated by economy aiming at revealing at an early stage the defective elements in a production process of which the cost increases very quickly at each successive stage of manufacture.

It is therefore an object of the present invention to provide a method complementary of the preceding one which, thanks to similar means arranged in specific manner, makes it possible to effect quality control of electrical continuity which the multiple equipotential branchings of each of the "trees" constituting the whole of the conductor network of the multi-layer printed circuits must normally present.

Accordingly, it is generally assumed that the assembly E of the metallic "chips" accessible on at least one outer face of a printed circuit of a determined technological model is normally constituted by a first sub-assembly Ei comprising only one "chip" belonging to each of the equipotential "trees" of the printed circuit to be controlled and by a second sub-assembly Ec comprising all the other "chips" of the circuit, with $E=Ei+Ec$.

It may therefore be concluded that the control of the continuity of the whole of the conductor network of a printed circuit is equivalent to testing the quality of the electrical connection having to exist between each "chip" of the sub-assembly Ec belonging to a given tree and the "chip" of the assembly Ei belonging to the same "tree". In other words, assuming that all the "chips" Ei are connected to a common conductor, the quality control is accomplished by the test of continuity between each of the dots of the assembly Ec and the conductor common to the assembly Ei.

One refinement of the method consists in considering that the sub-assembly Ec is itself constituted by two sub-assemblies such that $Ec=Eci+Ece$, Ece being the sub-assembly constituted by all the "chips" having the property of being ends of "trees", this particularly then allowing a complete test of continuity to be made between each of the "chips" of Ece and the conductor common to Ei.

Thus, with the same industrial preoccupations as those which motivated the Patent Application mentioned above, the present invention has for its object a device for effecting quality control of the electrical continuity of the conductor network of multi-layer printed circuits of various types and configurations—including the most compact resulting from so-called "hybrid" technology—which does not have the drawbacks of the known systems employing in particular different sets of sensors with tips.

SUMMARY OF THE INVENTION

According to the invention, this economic, high-performance control device comprises:

interface connector means, specific of a particular model of printed circuits to be controlled, adapted to effect, by fixed superposition with the latter, the selection from all the conductor elements (or chips) accessible on at least one of the outer faces of said printed circuit to be controlled, of two distinct electrically defined sub-assemblies;

means for scanning said interface connector means for effecting, by displaceable contact with the latter, the electrical detection of possible defects in continuity affecting the conductor network of the printed circuit to be controlled;

indicator means inserted between said scanning means and said interface connector means, for translating in preceptible manner the state of quality of the electrical continuity existing in the different branchings of the conductor network of the printed circuit to be controlled.

BRIEF DESCRIPTION OF THE DRAWINGS

The invention will be more readily understood on reading the following description with reference to the accompanying drawings, in which.

DETAILED DESCRIPTION OF A PREFERRED EMBODIMENT OF THE INVENTION

Figure 1:
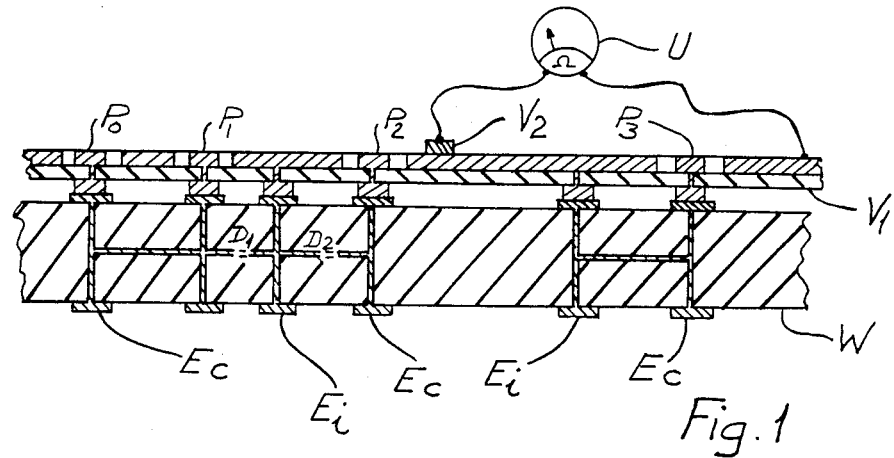
FIG. 1 schematically shows in section a device for testing a multi-layer printed circuit presenting two internal defects in continuity.

From the standpoint of practical operation, the method of continuity control according to the invention is carried out by using a test device set out in accordance with the diagram of FIG. 1.

Referring now to the drawings, this test device comprises a selective system with electrical contacts, combined by superposition with the specimen (W) of printed circuit to be tested, and composed of a pair ($V_1$ and $V_2$) of two associated printed circuits, capable of coplanar relative displacements in electrical connection with the indicator apparatus (U).

The circuit $V_1$, qualified as "specific interface circuit", is adapted to be superposed in strict geometrical register with the characteristic marks of the specimen W. To this end, it is constituted by an insulating screen, preferably made of thin, supple material, adapted to superficial metallization by any photochemical or like processes such as for example polyimide marketed under the name "KAPTON" or the like. The circuit $V_1$ is thus an insulating screen with metallized holes which comprises on one face the same assembly of chips E present on the opposite face of the specimen W and, on the other face, a conductor earth plane in which the first sub-assembly defined hereinabove of the chips Ei opens directly via a metallized hole (and are therefore in electrical connection with the earth plane) and the second sub-assembly of the chips Ec which are insulated from the conductor earth plane by a surrounding annular space bereft of metallization.

Chips Ei and Ec are generally round and with a diameter equal to the image of that of the chips of specimen W, but it is obvious that any other shapes adapted to each particular case of printed circuit to be controlled may perfectly well be suitable for carrying out the invention.

FIG. 1 clearly shows, in section, the structure of the specimen W of circuit to be controlled with its specific circuit $V_1$ superposed in test position, with the earth plane on the outside.

Figure 2:
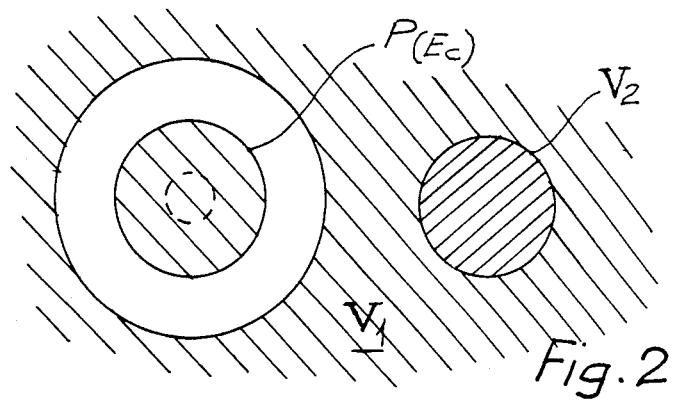
FIG. 2 shows, on a larger scale, the configuration and relative dimensions of one of the elementary test zones of FIG. 1, and FIG. 3 schematically shows the front and rear faces of the scanning circuit with which the device of FIG. 1 is equipped, to allow the simultaneous collective test of several conductor branchings of the printed circuit to be controlled.

If a "shoe" is now displaced in contact with the outer surface of the circuit $V_1$, complying with the following conditions (FIG. 2):

it is electrically conducting over all or part of its area;
the conducting part of this area is necessarily inscribed within the non-conducting zone of the earth plane surrounding each of the chips of the assembly Ec;
it cannot necessarily be inscribed in the annular space defined by a chip and the earth plane;

and if, in addition, an apparatus indicating the electrical continuity, for example an ohmmeter, is connected on the one hand to the earth plane and on the other hand to the conducting part of the mobile shoe, it is clear that, as long as it remains in contact with the earth plane or a coplanar chip belonging to a tree presenting an electrical continuity of normal quality, the indicator apparatus will not reveal any defect (case of chip $P_3$, FIG. 1). But if, on the other hand, the tree in question presents a defect (at $D_1$ or $D_2$, FIG. 1), this abnormal discontinuity will be observed only when the shoe comes into coplanar contact with the chips $P_1$ or $P_2$.

However according to the modus operandi which has just been set forth in principle, the scanning of the whole surface of the specific circuit $V_1$ by a single mobile shoe as has just been described would be a slow and fastidious operation. It is for this reason that the invention, in order to carry out the test in collective manner, provides using a second circuit $V_2$ made of material similar to circuit $V_1$, comprising a plurality of superficial conducting areas connected between faces by metallic holes. Each metallized hole opens out on the face turned towards the specific circuit $V_1$, in one of the multiple conducting areas corresponding to an elementary shoe as described hereinabove and, on the opposite face in a conducting track effecting the electrical connection with a collector element outside the indicator apparatus U.

Figure 3:
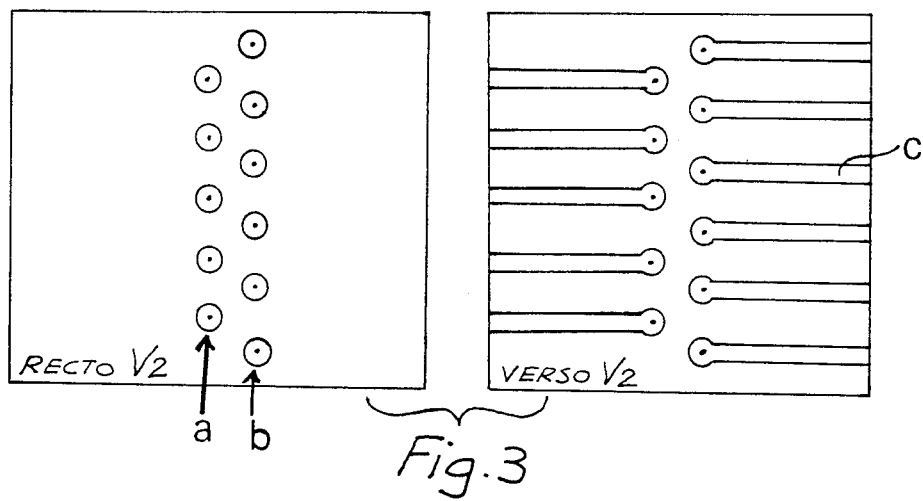

As indicated in FIG. 3, a printed test circuit $V_2$ may thus be made, for example, comprising two alignments (a, b) of elementary shoes, each of them being connected by a metallized hole to a conducting track located on the other face of the circuit.

This conducting track effects the electrical connection with the indicator apparatus U in order to demonstrate defects in continuity affecting any branching of the conducting network of the specimen W to be controlled. One of the rows (a, b) of aligned shoes may also be eliminated, the test operation then being carried out by making a reciprocating displacement of the circuit $V_2$, the forward movement being followed by a shift of the test circuit $V_2$ by a half-step between the chips with respect to the specific circuit $V_1$, in a direction perpendicular to the movement in the return direction.

What is claimed is:

1. A device for continuity testing multiple equipotential branches formed in a conductor network of a multilayer printed circuit, said circuit comprising an assembly E of conductor elements accessible on at least one of its outer faces, said device comprising:

interface connector means for said printed circuit adapted to connect, by superposition with said outer face, the conductor element of a first subassembly $E_i$ of said assembly E to a single first conducting area, and the conductor element of a second subassembly $E_c$ of said assembly E to a plurality of second conducting areas, the two subassemblies $E_i$ and $E_c$ being distinct and electrically predefined so that $E=E_i+E_c$;

means comprising at least a mobile conducting area in contact with one of said first and second conducting areas, for scanning said interface connector means; and indicator means, electrically connected between said first conducting area and said mobile conducting area, for detecting defects in electrical continuity between said first conducting area and said second conducting areas.

2. The control device of claim 1, wherein said interface connector means comprises a supple screen of insulating material comprising, over a free face thereof when superposed to said printed circuit, a coplanar arrangement of said first and second conducting areas mutually insulated, interconnected from said free face to an opposite face via metallized holes.

3. The control device of claim 2, wherein said first subassembly $E_i$ comprises one single conductor element per said multiple equipotential branches, and said second subassembly $E_c$ comprises all the other conductor elements of said printed circuit.

4. The control device of claim 1, wherein said first and second conducting areas of the interface connector means are arranged so that said first conducting area is a conducting earth plane coplanar with, and surrounding each of said second conducting areas, which forms conductor elements electrically insulated from said conducting earth plane by an annular space of constant width, such that said mobile conducting area, belonging to said scanning means, cannot be entirely inscribed in said annular space, but can necessarily be inscribed in the surface defined by the outer edge of said annular space.

5. The control device of claim 4, wherein said scanning means comprises a mobile supple screen of insulating material, having, on a first face, at least a row of conducting areas mutually insulated, interconnected via metallized holes with conducting tracks provided on a second face of said mobile supple screen, said indicator means being connected to said conducting tracks via collector means.

* * * * *